United States Patent
Sakai et al.

(10) Patent No.: US 9,679,851 B2
(45) Date of Patent: Jun. 13, 2017

(54) GRAPHENE WIRING STRUCTURE AND MANUFACTURING METHOD THEREOF

(71) Applicant: Kabushiki Kaisha Toshiba, Minato-ku (JP)

(72) Inventors: Tadashi Sakai, Yokohama (JP); Hisao Miyazaki, Yokohama (JP); Masayuki Katagiri, Kawasaki (JP); Yuichi Yamazaki, Inagi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/055,894

(22) Filed: Feb. 29, 2016

(65) Prior Publication Data

US 2016/0284646 A1    Sep. 29, 2016

(30) Foreign Application Priority Data

Mar. 23, 2015   (JP) ................. 2015-059052

(51) Int. Cl.
| | | |
|---|---|---|
| *H01L 23/532* | (2006.01) | |
| *H01L 23/528* | (2006.01) | |
| *H01L 21/02* | (2006.01) | |
| *H01L 21/768* | (2006.01) | |

(52) U.S. Cl.
CPC .. *H01L 23/53276* (2013.01); *H01L 21/02227* (2013.01); *H01L 21/02236* (2013.01); *H01L 21/02247* (2013.01); *H01L 21/76838* (2013.01); *H01L 23/5329* (2013.01); *H01L 21/02252* (2013.01)

(58) Field of Classification Search
CPC ............ H01L 23/528; H01L 23/53276; H01L 21/02603
See application file for complete search history.

(56) References Cited

U.S. PATENT DOCUMENTS

| | | | |
|---|---|---|---|
| 2010/0206363 A1 | 8/2010 | Choi | |
| 2011/0033746 A1* | 2/2011 | Liu | ................. H01M 4/366 429/209 |
| 2013/0230722 A1 | 9/2013 | Fujii et al. | |
| 2013/0341792 A1 | 12/2013 | Noda et al. | |

(Continued)

FOREIGN PATENT DOCUMENTS

| | | |
|---|---|---|
| JP | 5152945 | 2/2013 |
| JP | 2014-96411 | 5/2014 |
| JP | 2014-183210 | 9/2014 |

(Continued)

OTHER PUBLICATIONS

U.S. Appl. No. 14/842,239, filed Sep. 1, 2015, Hisao Miyazaki, et al.

(Continued)

*Primary Examiner* — Cuong Q Nguyen
(74) *Attorney, Agent, or Firm* — Oblon, McClelland, Maier & Neustadt, L.L.P.

(57) ABSTRACT

A graphene wring structure of an embodiment includes multilayer graphene, a first interlayer compound existing in an interlayer space of the multilayer graphene, and a second interlayer compound existing in the interlayer space of the multilayer graphene. The second interlayer compound containing at least one of an oxide, a nitride and a carbide.

20 Claims, 4 Drawing Sheets

(56) References Cited

U.S. PATENT DOCUMENTS

2016/0086890 A1  3/2016  Miyazaki et al.
2016/0086891 A1  3/2016  Miyazaki et al.

FOREIGN PATENT DOCUMENTS

| JP | 2016-63095 A | 4/2016 |
| JP | 2016-63096 A | 4/2016 |
| WO | WO 2012/070385 A1 | 5/2012 |

OTHER PUBLICATIONS

U.S. Appl. No. 14/842,249, filed Sep. 1, 2015, Hisao Miyazaki, et al.

Japanese Office Action issued Mar. 8, 2016 in Japanese Application No. 2015-059052 (with English Translation).

Daiyu Kondo, et al., "Sub-10-nm-wide intercalated multi-layer graphene interconnects with low resistivity", IEEE, 2014, 3 pgs.

* cited by examiner

GRAPHENE WIRING STRUCTURE AND MANUFACTURING METHOD THEREOF

CROSS-REFERENCE TO RELATED APPLICATION

This application is based upon and claims the benefit of priority from Japanese Patent Application No. 2015-059052, filed on Mar. 23, 2015; the entire contents of which are incorporated herein by reference.

FIELD

Embodiments described herein relate to a graphene wiring structure and a manufacturing method thereof.

BACKGROUND

With higher integration and microminiaturization of memories or the like, microminiaturization of multilayer wiring in a chip is also on demand. It is predicted that a state-of-the-art flash memory would open a realm of a half pitch of 10 nm or less around 2020. Meanwhile, resistivity of metal wiring such as Cu presently in use is radically increasing along with microminiaturization thereof due to increasing inelastic scattering, thus approaching the limit of the material. Contrary to this, it has been reported that nanocarbon materials represented by graphene or carbon nanotube (CNT) have remarkably long mean free path or high mobility even in a micro-region as compared to metals and thus nanocarbon materials are expected as next-generation micro-wiring materials. Especially, graphene has a possibility that wiring with a fine width can be formed by a lithography process having compatibility with the existing large scale integration (LSI) process. Therefore, development of integrated wiring with a fine width has been accelerated based on multilayer graphene by chemical vapor deposition (CVD).

DETAILED DESCRIPTION

A graphene wring structure of an embodiment includes multilayer graphene, a first interlayer compound existing in an interlayer space of the multilayer graphene, and a second interlayer compound existing in the interlayer space of the multilayer graphene. The second interlayer compound containing at least one of an oxide, a nitride and a carbide.

A manufacturing method of a graphene wiring structure of an embodiment includes inserting a first interlayer compound into an interlayer space of a multilayer graphene processed into a wiring shape, and forming a second interlayer compound, containing at least one selected from among oxides, nitrides, and carbides, in the interlayer space of the multilayer graphene inserted with the first interlayer compound.

First Embodiment

A graphene wiring structure according to a first embodiment includes, multilayer graphene, a first interlayer compound existing in an interlayer space of the multilayer graphene and a second interlayer compound. The second interlayer compound exists in the interlayer space of the multilayer graphene and contains at least one of an oxide, a nitride and a carbide.

Figure 1:
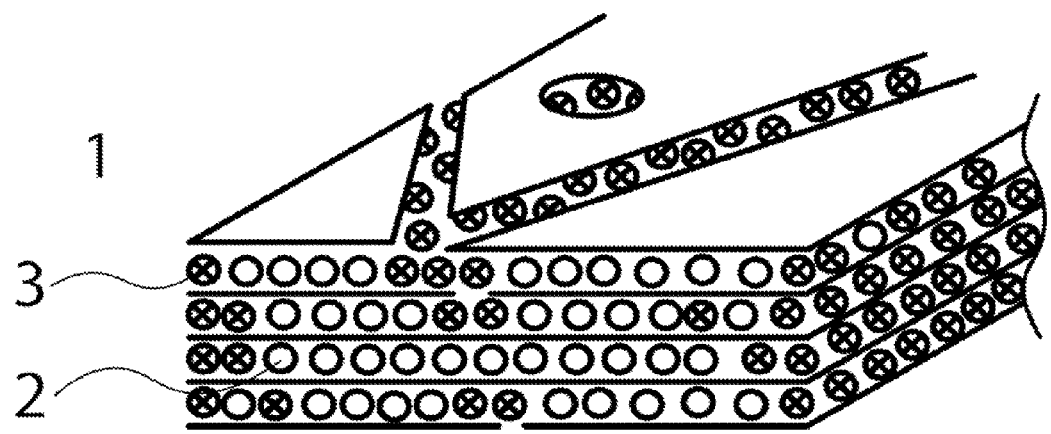
FIG. 1 is a schematic perspective view of a graphene wiring structure of an embodiment.
Figure 2:
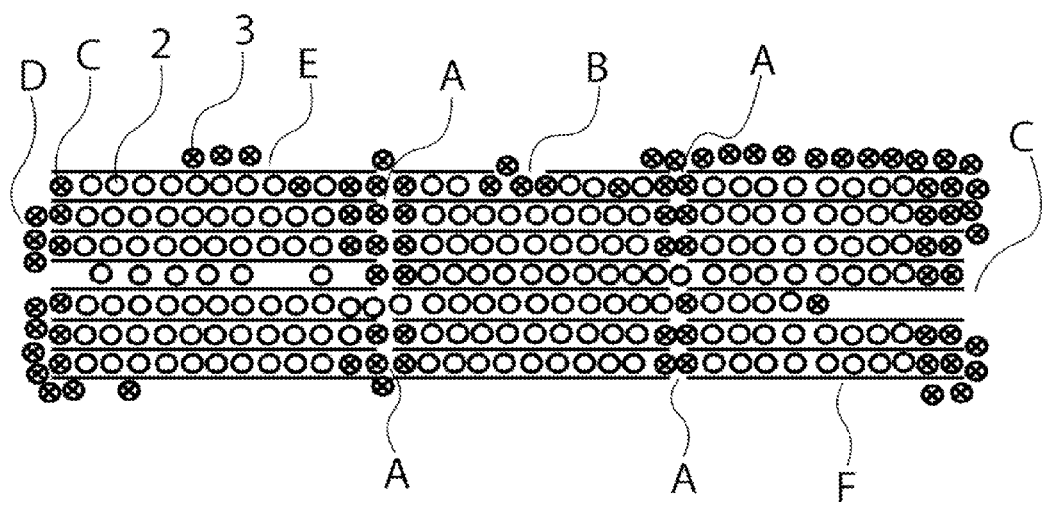
FIG. 2 is a schematic cross-section of the graphene wiring structure of the embodiment.

FIG. 1 is a schematic perspective view of the graphene wiring structure of the first embodiment. The graphene wiring structure in FIG. 1 includes multilayer graphene 1, a first interlayer compound 2, and a second interlayer compound 3. FIG. 2 is a schematic cross-section of the graphene wiring structure of the first embodiment. The cross-section in FIG. 2 illustrates that the second interlayer compound 3 exists in an interlayer space (a grain boundary A, a flaw B, and an interlayer space C) and in outer peripheral portions (a side surface D, an outermost surface E, and a bottommost surface F) of the multilayer graphene 1 while the first interlayer compound 2 exists in the interlayer space of the multilayer graphene 1.

Note that, for example, when a substrate or the like exists on a side of the bottommost surface F, the second interlayer compound 3 does not exist or exists by a small quantity on the side of the bottommost surface F.

The graphene wiring structure of the embodiment is used for, for example, wiring in a lateral direction in a semiconductor device. Therefore, it is preferable that the graphene wiring structure of the embodiment is used for micro-wiring connecting terminals such as electrodes in a semiconductor device. Semiconductor devices employing the graphene wiring structure of the embodiment may be semiconductor devices or the like such as micro-processing unit (MPU) or NAND flash memory chip where micro-wiring is required. It is preferable that the second interlayer compound 3 is in physical contact with an edge of the multilayer graphene 1. The edge of the multilayer graphene is an edge(s) of a flat graphene sheet(s) which is included in the multilayer graphene 1.

The multilayer graphene 1 is a lamination of flat graphene sheets (namely, a graphene nanoribbon) processed in a wiring shape. A wiring width of the graphene wiring structure, namely, a wiring width of the multilayer graphene 1 is 3 μm or less which allows an interlayer compound to leak out easily in the related art. Specifically, a wiring width of 20 nm or less or 10 nm or less (e.g. 5 nm or more to 10 nm or less) required for graphene wiring is preferable due to both crucial increase of metal-wiring resistance and a remarkable effect in suppressing leakage of the first interlayer compound 2 of the embodiment. The wiring width of the multilayer graphene 1 can be measured through observation by a scanning type electron microscope or a transmission type electron microscope. The wiring width of the multilayer graphene 1 is a width of the flat graphene sheet in an orthogonal direction to a lamination direction of the multilayer graphene 1 and in an orthogonal direction to a longitudinal direction of the wiring of the multilayer graphene 1. The wiring width of the multilayer graphene 1 is a length of a side shorter than the other side excluding the thickness of the flat graphene sheet.

The multilayer graphene 1 of the embodiment is a lamination where the flat graphene sheets are laminated for about, for example, 10 to 100 layers. A thickness of the multilayer graphene 1 is typically 5 nm or more to 50 nm or less depending on the number of the laminated flat graphene sheets and an interlayer compound. The multilayer graphene 1, may it be single crystal graphene or polycrystalline graphene, has an effect as that of the embodiment. When the multilayer graphene 1 is polycrystalline graphene, an oxidization, nitridization, or carbonization treatment can be easily applied from a flaw or grain boundary thereof. Therefore, from a perspective of suppressing leakage of the first interlayer compound 2, the multilayer graphene 1 is more preferably polycrystalline graphene. Polycrystalline graphene is fabricated by, for example, a CVD method at a low temperature.

The first interlayer compound 2 exists in the interlayer space of the multilayer graphene 1. The first interlayer compound 2 is one or more types of molecules or atoms enhancing conductivity of the multilayer graphene 1. The first interlayer compound 2 may specifically be one or more types selected from among metal chloride(s), metal fluoride(s), alkali metal(s), alkaline-earth metal(s), halogen(s), and interhalogen compound(s). The preferable first interlayer compound 2 is selected in consideration of resulting conductivity or manufacturing conditions.

A metal contained in the metal chloride or the metal fluoride may specifically be one or more types selected from among Fe (Iron), Cu (Cupper), Al (Aluminum) and Mo (Molybdenum). The metal chloride containing a metal such as Fe (Iron), Cu (Cupper), Al (Aluminum) or Mo (Molybdenum) may be one or more types selected from among $FeCl_3$, $CuCl_2$, $AlCl_3$, $MoCl_5$, etc. A metal contained in the metal fluoride may specifically be B (Boron), As (Arsenic), or the like. The metal fluoride containing a metal such as B (Boron) or As (Arsenic) may be one or more types selected from among $BF_3$, $AsF_5$, etc.

The alkali metal may be one or more types selected from among Li (Lithium), Na (Sodium), K (Potassium), etc.

The alkaline-earth metal may be one or more types selected from among Mg (Magnesium), Ca (Calcium), etc.

The halogen may be one or more types selected from among $F_2$, $Cl_2$, $Br_2$, $I_2$, etc.

The interhalogen compound may be a compound containing I and another halogen (F (Florine), Cl (Chlorine), or Br (Bromide)). More specifically, the interhalogen compound may be one or more types selected from among IBr, ICl, etc.

Specifically, the first interlayer compound 2 is preferably one or more types selected from among the metal chloride containing a metal such as Fe (Iron), Cu (Cupper), Al (Aluminum) or Mo (Molybdenum), the metal fluoride containing a metal such as B (Boron) or As (Arsenic), and compounds containing Li (Lithium), Na (Sodium), K (Potassium), Mg (Magnesium), Ca (Calcium), $F_2$, $C_{19}$, $Br_2$, or I (Iodine) and another halogen (F (Fluorine), Cl (Chlorine), or Br (Bromide)).

More specifically, the first interlayer compound 2 is preferably one or more types selected from among $FeCl_3$, $CuCl_2$, $AlCl_3$, $MoCl_5$, $BF_3$, $AsF_5$, Li (Lithium), Na (Sodium), K (Potassium), Mg (Magnesium), Ca (Calcium), $F_2$, $Cl_2$, $Br_2$, IBr, and ICl.

The second interlayer compound 3 exists at least in the interlayer space of the multilayer graphene 1. The second interlayer compound 3 is preferably one or more types selected from among metal oxide(s), metal nitride(s), and metal carbide(s). The metal oxide, the metal nitride, or the metal carbide is a compound (oxide, nitride or carbide) of a metal containing one or more types selected from among metals containing Fe (Iron), Cu (Cupper), Al (Aluminum or Mo (Molybdenum).

A specific example of the metal oxide may be one or more types selected from among $Fe_2O_3$, CuO, $Al_2O_3$, $MoO_2$, and the like. A specific example of the metal nitride may be one or more types selected from among $Fe_3N$, $Cu_3N_2$, AlN, $MoN_x$, and the like. A specific example of the metal carbide may be one or more types selected from among $Fe_3C$, $Cu_2C$, $Al_4C_3$, $Mo_2C$, and the like.

The first interlayer compound 2 and the second interlayer compound 3 may or may not contain a common metal.

Next, a relationship between the multilayer graphene 1 and the first interlayer compound 2 and the second interlayer compound 3 will be described. The first interlayer compound 2 enhancing conductivity of the multilayer graphene 1 as described above exists in the interlayer space of the multilayer graphene 1 of the embodiment. It has been known that the first interlayer compound 2 can stably exist when the wiring width is wide such as that the width of the multilayer graphene 1 is greater than 5 μm while the first interlayer compound 2 becomes unstable and prone to leakage from the interlayer space of the multilayer graphene 1 when the wiring width is 3 μm or less, or even narrower, in a nano-order.

Figure 3:
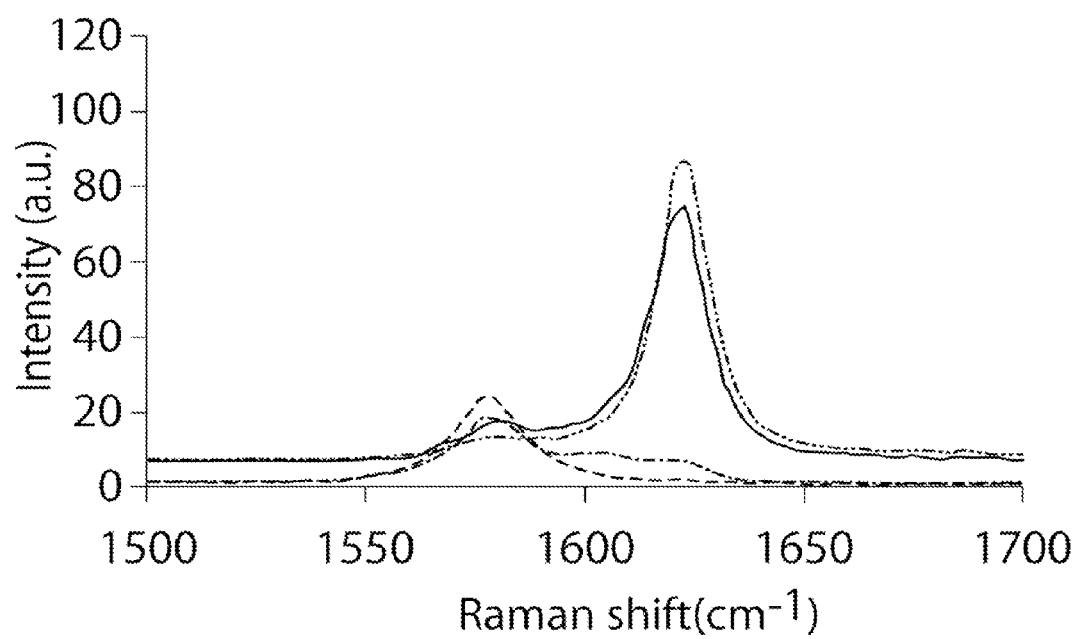
FIG. 3 is a graph showing Raman shift of the graphene wiring structure of the embodiment.

FIG. 3 illustrates a graph showing Raman shift when the first interlayer compound 2 is inserted in the multilayer graphenes 1 having different wiring widths. For Raman shift in FIG. 3, a sample not including the second interlayer compound 3 was measured. After inserting the first interlayer compound 2 in the multilayer graphene 1, the sample was placed in the air atmosphere for measuring Raman shift. In the graph in FIG. 3, the vertical axis represents intensity (arbitrary unit (a.u.)) while the horizontal axis represents Raman shift ($cm^{-1}$). In FIG. 3, a dashed-two dotted line, solid line, dashed-dotted line, and broken line represent Raman shift for the multilayer graphene 1 of 10 μm in width, the multilayer graphene 1 of 4 μm in width, the multilayer graphene 1 of 3 μm in width, and the multilayer graphene 1 of 2 μm in width, respectively. The multilayer graphenes 1 were obtained by fabricating polycrystalline graphene by CVD in a high temperature (1000° C.) and processing the polycrystalline graphene into 10 μm wide to 2 μm wide. The multilayer graphene 1 fabricated by high-temperature CVD has less grain boundaries and flaws. As the first interlayer compound 2, $FeCl_3$ was used. Peaks caused by the multilayer graphene 1 exist around 1580 $cm^{-1}$. Moreover, peaks of Raman shift caused by $FeCl_3$ existing in the interlayer space of the multilayer graphene 1 exist around 1625 $cm^{-1}$. As apparent from FIG. 3, an intensity ratio of the peak around 1580 $cm^{-1}$ for the multilayer graphene 1 having a wiring width of 3 μm to the peak around 1625 $cm^{-1}$ for the multilayer graphene 1 having a wiring width of 4 μm is extremely large. That is, it is clear that the first interlayer compound 2 is prone to leakage when the wiring width of the multilayer graphene 1 is 3 μm or less. The result in the graph in FIG. 3 shows that $FeCl_3$ (first interlayer compound 2) is prone to leakage from the side surface of the multilayer graphene 1.

Figure 4:
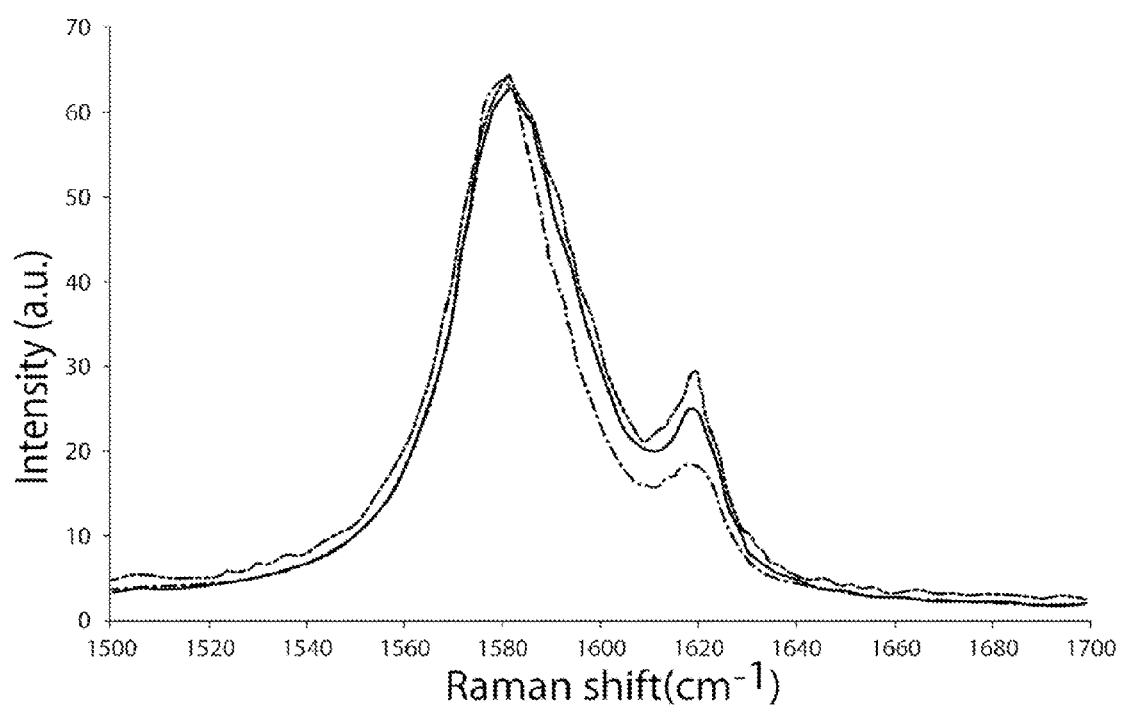
FIG. 4 is a graph showing Raman shift of the graphene wiring structure of the embodiment.

FIG. 4 illustrates another graph showing Raman shift when the first interlayer compound 2 is inserted in the multilayer graphenes 1 having different wiring widths. For Raman shift in FIG. 4, a sample not including the second interlayer compound 3 was measured. After inserting the first interlayer compound 2 in the multilayer graphene 1, the sample was placed in the air atmosphere for measuring Raman shift. In the graph in FIG. 4, the vertical axis represents intensity (arbitrary unit (a.u.)) while the horizontal axis represents Raman shift ($cm^{-1}$). For Raman shift shown in FIG. 4, the multilayer graphenes 1, fabricated by CVD at a low temperature of 650° C., having different wiring widths were used. As the first interlayer compound 2, $FeCl_3$ was used. In FIG. 4, a dashed-two dotted line, solid line, and dashed-dotted line represent Raman shift for the multilayer graphene 1 of 1 μm in width, the multilayer graphene 1 of 5 μm in width, and the multilayer graphene 1 of 20 μm in width, respectively. Peaks caused by the multilayer graphene 1 exist around 1580 $cm^{-1}$. Moreover, peaks of Raman shift caused by $FeCl_3$ existing in the interlayer space of the multilayer graphene 1 exist around 1625 $cm^{-1}$. The multilayer graphene 1 fabricated by low-temperature CVD has more flaws or grain boundaries as compared to the multilayer graphene 1 fabricated by high-temperature CVD. In the graph in FIG. 4, intensity ratios of the peaks existing around 1580 $cm^{-1}$ to those around 1625 $cm^{-1}$ show that a large amount of $FeCl_3$ has leaked out from the multilayer graphene 1 regardless of the wiring width. The result in the graph in FIG. 4 shows that $FeCl_3$ (first interlayer compound 2) is prone to leakage not only from the side surface of the multilayer graphene 1 but also from the grain boundary or flaw thereof.

In the embodiment, therefore, the first interlayer compound 2 and the second interlayer compound 3 are mixed in the interlayer space of the multilayer graphene 1 in order to stabilize the first interlayer compound 2, that is, to suppress leakage thereof from the side surface, grain boundary, or flaw of the multilayer graphene 1. The second interlayer compound 3 is more stable than the first interlayer compound 2 since the second interlayer compound 3 is a metal oxide, metal nitride, or metal carbide. When the second interlayer compound 3 exists in the interlayer space of the multilayer graphene 1, the second interlayer compound 3 functions as an obstacle preventing transfer or leakage, from the interlayer space, of the first interlayer compound 2, thereby the first interlayer compound 2 can stably exist in the interlayer space of the multilayer graphene 1.

The first interlayer compound 2 is extremely prone to leakage especially from the grain boundary and flaw out of the interlayer space of the flat graphene sheets forming the multilayer graphene 1. Therefore, as in FIGS. 1 and 2, it is preferable that the second interlayer compound 3 exists such that the second interlayer compound 3 blocks at least a part of the grain boundary and flaw of the flat graphene sheet. The cross section in FIG. 2 illustrates a multilayer graphene wiring structure where leakage of the first interlayer compound 2 is suppressed by the second interlayer compound 3. The second interlayer compound 3 in the cross-section in FIG. 2 exists in the grain boundary A, flaw B, interlayer space C, side surface D, outermost surface E, and bottommost surface F of the multilayer graphene 1 and stabilizes the first interlayer compound 2.

When the multilayer graphene 1 includes a region where the first interlayer compound 2 is stabilized due to existence of the second interlayer compound 3 in the grain boundary or flaw of the flat graphene sheet forming the multilayer graphene 1, such a region forms a conductive path. Therefore, stabilization of the first interlayer compound 2 in a partial region results in reduced resistance in conductivity of the multilayer graphene 1. It is more preferable that resistance in all of the conductive paths is reduced by the first interlayer compound 2 and second interlayer compound 3. Increasing the regions where the resistance is reduced allows for suppressing heat generation caused by wiring resistance, thereby suppressing leakage of the first interlayer compound 2 due to heat generation.

More preferably, the second interlayer compound 3 exists in at least a part of the side surface of the multilayer graphene 1. The side surface of the multilayer graphene 1 is a laminated plane, of the multilayer graphene 1, formed by edge surfaces of the flat graphene sheets forming the multilayer graphene 1. It is more preferable that the second interlayer compound 3 exists on the side surface of the multilayer graphene 1 since such an arrangement can further suppress leakage of the first interlayer compound 2. Note that, from such an perspective, it is more preferable that the second interlayer compound 3 exists on the entire surface of the side surface(s) of the multilayer graphene 1. On the side surface of the multilayer graphene 1, the second interlayer compound 3 tends to be connected with each other than in the grain boundary or flaw of the flat graphene sheet. Since the second interlayer compound 3 is more stable when connected with each other than when existing alone. This contributes to reducing resistance in the multilayer graphene 1.

More of the second interlayer compound 3 exists on the surface of the multilayer graphene 1. More preferably, the second interlayer compound 3 existing on the surface of the multilayer graphene 1 is connected with the second interlayer compound 3 existing on the side surface of the multilayer graphene 1. It is preferable that the second interlayer compound 3 exists on the surface and the side surface since the second interlayer compound 3 existing on the surface of the multilayer graphene 1 stabilizes the second interlayer compound 3 existing on the side surface of the multilayer graphene 1. Note that the surface of the multilayer graphene 1 includes the outermost surface and the bottommost surface of the flat graphene sheet forming the multilayer graphene 1.

As described above, in the embodiment, the second interlayer compound 3 existing in the interlayer space, side surface, or a surface of the multilayer graphene 1 prevents leakage of the first interlayer compound 2, thereby enhancing conductivity of the multilayer graphene 1.

Figure 5:
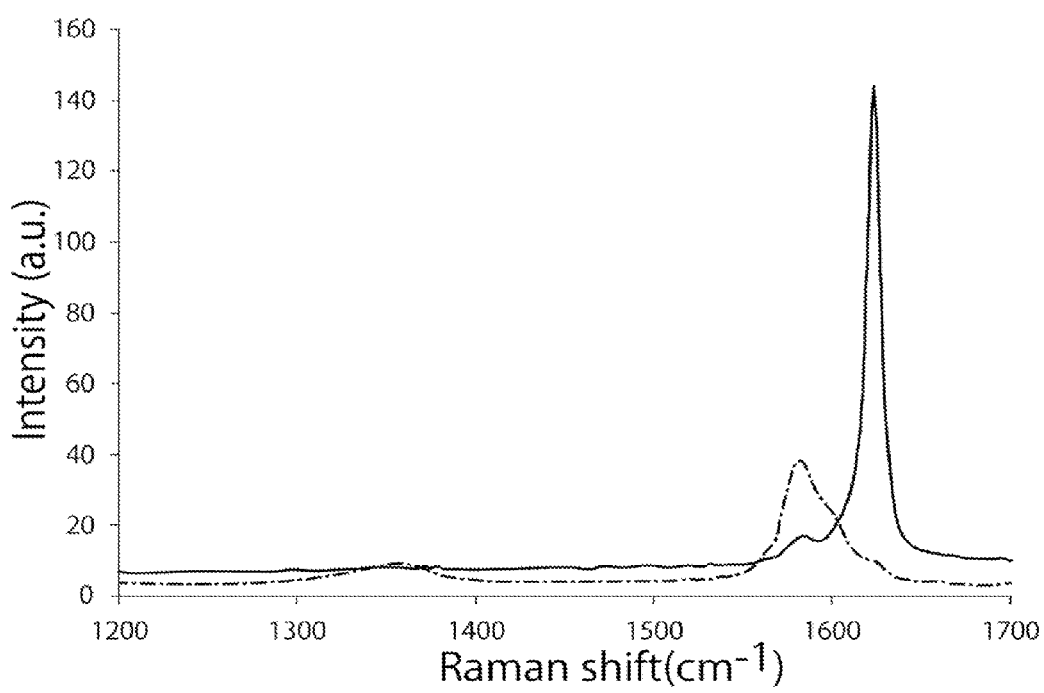
FIG. 5 is a graph showing Raman shift of the graphene wiring structure of the embodiment.

FIG. 5 illustrates a graph of Raman shift of a sample of the multilayer graphene 1 having the first interlayer compound 2 and the second interlayer compound 3 existing in the interlayer space of the multilayer graphene 1. In the graph in FIG. 5, the vertical axis represents intensity (a.u.) while the horizontal axis represents Raman shift ($cm^{-1}$). A solid line in FIG. 5 shows Raman shift of the multilayer graphene 1, fabricated by low-temperature CVD, where $FeCl_3$ (first interlayer compound 2) and $Fe_2O_3$ (second interlayer compound 3) exist in the interlayer space of a wiring width of 2 μm. A dashed-dotted line in FIG. 5 shows Raman shift of a sample where no interlayer compound has been inserted and thus neither $FeCl_3$ (first interlayer compound 2) nor $Fe_2O_3$ (second interlayer compound 3) exist in the interlayer space. Comparison between the solid line and the dashed-dotted line in FIG. 5 shows that the graph in solid line has a small peak around 1580 $cm^{-1}$ and a high peak around 1625 $cm^{-1}$. The graph in solid line in FIG. 5 shows that the sample thereof has retained more of $FeCl_3$ (first interlayer compound 2) even with a narrower wiring width. This shows that $Fe_2O_3$ (second interlayer compound 3) suppressed leakage of $FeCl_3$ (first interlayer compound 2). Leakage of the first interlayer compound 2 was suppressed even when the multilayer graphene 1 fabricated by low-temperature CVD was used. This shows that the second interlayer compound 3 can suppress leakage of the first interlayer compound 2 from the side surface, grain boundary, or flaw of the multilayer graphene 1.

Second Embodiment

Next, as a second embodiment, a manufacturing method of the graphene wiring structure of the first embodiment will be described. A manufacturing method of graphene wiring structure as will be described below includes inserting the first interlayer compound 2 into the interlayer space of the multilayer graphene 1 processed into a wiring shape and a forming the second interlayer compound 3 in the interlayer space of the multilayer graphene 1 inserted with the first interlayer compound 2. In the forming the second interlayer compound 3 in the interlayer space of the multilayer graphene 1 inserted with the first interlayer compound 2, it is preferable that the multilayer graphene 1 inserted with the first interlayer compound 2 is processed in an atmosphere containing oxidizing gas, nitriding gas, or carbonizing gas.

First, a mask, processed into a wiring shape such that the wiring width is 10 nm or more to 3 µm or less, is formed on a multilayer graphene fabricated by the CVD method. A multilayer graphene layer is then subjected to thinning with a lithography technique into a wiring shape to form the multilayer graphene 1. The multilayer graphene 1 may be pre-processed into the wiring shape.

The inserting the first interlayer compound 2 into the interlayer space of the multilayer graphene 1 is processing where the multilayer graphene 1 is processed in a mixed gas atmosphere of the first interlayer compound 2 and inert gas and then the first interlayer compound 2 is intercalated (inserted) into the interlayer space of the multilayer graphene 1. In the atmosphere of the process, the multilayer graphene 1 is heated to, for example, 200° C. to 300° C. and retained thereat until the first interlayer compound 2 is sufficiently intercalated into the interlayer space of the multilayer graphene 1. The first interlayer compound 2 is subjected to oxidization, nitridization, or carbonization in the second embodiment, and thus, the first interlayer compound 2 is a chloride containing one or more types of metals selected from among Fe, Cu, Al and Mo. Specifically, the first interlayer compound 2 of the second embodiment is as described in the first embodiment.

The next process of forming the second interlayer compound 3 in the interlayer space of the multilayer graphene 1 inserted with the first interlayer compound 2 is processing of forming an oxide, nitride or carbide by replacing the mixed gas atmosphere of the first interlayer compound 2 and inert gas with an atmosphere containing oxidizing gas, nitriding gas, or carbonizing gas. With the oxidizing gas, nitriding gas, or carbonizing gas, the second interlayer compound 3, physically or chemically more stable than the first interlayer compound 2, is formed, thereby preventing leakage of the first interlayer compound 2.

Preferably, the inert gas may be a noble gas such as helium and argon or nitrogen gas, or the like. Any component that does not react with the first interlayer compound 2 or the multilayer graphene 1 may be included in the atmosphere of the process. A pressure or processing time is adjusted as appropriate according to conditions such as a line width. The multilayer graphene 1 is processed under conditions where sufficient intercalation occurs.

The second interlayer compound 3 is formed by oxidization, nitridization, or carbonization of a metal contained in the metal chloride of the first interlayer compound 2 existing in the interlayer space of the multilayer graphene 1. The oxidizing gas, nitriding gas, or carbonizing gas enters not only the interlayer space of the multilayer graphene 1 but also the grain boundary or flaw of the multilayer graphene 1, whereat reaction with the metal is carried out, thereby forming the second interlayer compound 3. In such a method, forming a large amount of the second interlayer compound 3 in the interlayer space, grain boundary, or flaw that are leaking points of the first interlayer compound 2 allows for blocking the leaking points of the first interlayer compound 2 with the second interlayer compound 3, thereby preventing a decrease in conductivity of the graphene wiring structure.

The oxidizing gas may be gas containing one or more types of gases, having an oxidative effect, selected from among oxygen gas, oxygen plasma gas, dinitrogen monoxide plasma gas, and the like. The nitriding gas may be gas containing one or more types of gases, having a nitriding effect, selected from among ammonia, ammonia plasma, nitrogen plasma, and the like. The carbonizing gas may be plasma gas (gas containing hydrocarbon plasma), having a carbonizing effect, of a hydrocarbon system such as acetylene. A pressure or processing time is adjusted as appropriate according to conditions such as a gas type or a line width. The processing is performed under conditions where the second interlayer compound 3 is generated.

Note that, after replacing with the atmosphere containing oxidizing gas, the atmosphere can further be replaced with an atmosphere containing nitriding gas or carbonizing gas. Replacing the atmosphere in this manner allows for forming two or more types of compounds of an oxide, nitride or carbide as the second interlayer compound 3.

It is not preferable to allow the multilayer graphene 1 to return to a normal temperature or to release the multilayer graphene 1 to the air atmosphere before forming the second interlayer compound 3 in the multilayer graphene 1 inserted with the first interlayer compound 2. This is because the first interlayer compound 2 gradually leaks out from the interlayer space of the multilayer graphene 1 as described above, resulting in a decrease or loss of mitigating effect of resistance. When returned to a normal temperature, the relatively unstable first interlayer compound 2 becomes prone to leakage from the multilayer graphene 1. Also, when released to the air atmosphere, the first interlayer compound 2 becomes prone to leakage due to actions of moisture or the like in the air atmosphere. Therefore, it is preferable to shift to the next process promptly. It is more preferable to shift to the next process without allowing the multilayer graphene 1 to be in contact with the air atmosphere while maintaining a temperature of 100° C. or more to 300° C. or less.

Third Embodiment

Next, as a third embodiment, a manufacturing method of the graphene wiring structure of the first embodiment will be described. A manufacturing method of graphene wiring structure as will be described below includes inserting the first interlayer compound 2 into the interlayer space of the multilayer graphene 1 processed into a wiring shape and a forming the second interlayer compound 3 in the interlayer space of the multilayer graphene 1 inserted with the first interlayer compound 2. In the forming the second interlayer compound 3 in the interlayer space of the multilayer graphene 1 inserted with the first interlayer compound 2, it is preferable that the multilayer graphene 1 inserted with the first interlayer compound 2 is processed in an atmosphere containing a metal or a metal chloride and oxidizing gas, nitriding gas, or carbonizing gas.

In the second embodiment, the mixed atmosphere of the first interlayer compound 2 and the inert gas, used in the inserting the first interlayer compound 2 into the interlayer space of the multilayer graphene 1 is replaced with the atmosphere containing oxidizing gas, nitriding gas, or carbonizing gas. In the third embodiment, however, an atmosphere containing a metal or metal chloride and oxidizing gas, nitriding gas, or carbonizing gas is used in the forming the second interlayer compound 3 in the interlayer space of the multilayer graphene 1, which is different from the second embodiment. Descriptions on processing or atmosphere common to the third embodiment and the second embodiment are omitted.

In the third embodiment, the second interlayer compound 3 can be formed without oxidization, nitridization, or carbonization of the first interlayer compound 2. Therefore, in the third embodiment, the first interlayer compound is not limited to a chloride containing one or more types of metals selected from among Fe, Cu, Al and Mo but may be the first interlayer compound 2 as have listed in the first embodiment.

When the first interlayer compound 2 includes a chloride containing one or more types of metals selected from among Fe, Cu, Al and Mo, the first interlayer compound 2 may also be oxidized, nitridized, or carbonized to form a part of the second interlayer compound 3. When the first interlayer compound 2 is other than a chloride containing one or more types of metals selected from among Fe, Cu, Al and Mo, the metal or metal chloride contained in the atmosphere containing oxidizing gas, nitriding gas, or carbonizing gas reacts to form the second interlayer compound 3.

The second interlayer compound 3 is formed by oxidization, nitridization, or carbonization of the metal or metal chloride contained in the atmosphere containing oxidizing gas, nitriding gas, or carbonizing gas. Moreover, the second interlayer compound 3 is formed by oxidization, nitridization, or carbonization of the first interlayer compound 2 by oxidizing gas, nitriding gas, or carbonizing gas. The metal contained in the first interlayer compound 2 and the metal contained in the second interlayer compound 3 may be the same or different from each other.

The metal or chloride to form the second interlayer compound 3 after reaction with oxidizing gas, nitriding gas, or carbonizing gas is preferably one or more types of metals selected from among metals containing Fe, Cu, Al and Mo or a chloride of one or more types of metals selected from among metals containing Fe, Cu, Al and Mo. A metal is preferably in a state prone to oxidization, nitridization, or carbonization and thus the metal is preferably ionized. More specifically, the metal chloride is preferably one or more types of metals or chlorides selected from among $FeCl_3$, $CuCl_2$, $AlCl_3$, and $MoCl_5$ to form the second interlayer compound 3.

Note that, after replacing with the atmosphere containing oxidizing gas and a metal or metal chloride, the oxidizing gas can further be replaced with an atmosphere containing nitriding gas or carbonizing gas. Replacing the atmosphere in this manner allows for forming two or more types of compounds of an oxide, nitride or carbide as the second interlayer compound 3.

In the processing method of the third embodiment, the multilayer graphene 1 inserted with the first interlayer compound 2 in the interlayer space thereof is processed with a metal or metal chloride and oxidizing gas or the like and thus more of the second interlayer compound 3 is formed on an outer periphery, namely the side surface and the surface, of the multilayer graphene 1 as compared to the processing method of the second embodiment. This is preferable from a perspective of suppressing leakage of the first interlayer compound 2. Similarly to the second embodiment, the manufacturing method of the third embodiment also allows for blocking the leaking points of the first interlayer compound 2 with the second interlayer compound 3, thereby preventing a decrease in conductivity of the graphene wiring structure.

Fourth Embodiment

Next, as a fourth embodiment, a manufacturing method of the graphene wiring structure of the first embodiment will be described. A manufacturing method of graphene wiring structure as will be described below includes inserting the first interlayer compound 2 into the interlayer space of the multilayer graphene 1 processed into a wiring shape and a forming the second interlayer compound 3 in the interlayer space of the multilayer graphene 1 inserted with the first interlayer compound 2. In the forming the second interlayer compound 3 in the interlayer space of the multilayer graphene 1 inserted with the first interlayer compound 2, it is preferable that the multilayer graphene 1 inserted with the first interlayer compound 2 is processed in an atmosphere containing oxidizing gas, nitriding gas, or carbonizing gas and then the multilayer graphene 1 is processed in an atmosphere containing a metal or a metal chloride and oxidizing gas, nitriding gas, or carbonizing gas.

The fourth embodiment is a manufacturing method of the graphene wiring structure where the manufacturing methods of the second embodiment and the third embodiment are combined. First, processing the multilayer graphene 1 inserted with the first interlayer compound 2 with an atmosphere containing oxidizing gas, nitriding gas, or carbonizing gas causes the oxidizing gas, nitriding gas, or carbonizing gas to enter from the interlayer space, grain boundary, or flaw to allow an oxide, nitride or carbide, to become the second interlayer compound 3, to be formed. Here, further processing the multilayer graphene 1 where an oxide, nitride or carbide, to become the second interlayer compound 3, has been formed in the aforementioned processing with the atmosphere containing a metal or metal chloride and oxidizing gas, nitriding gas, or carbonizing gas causes the second interlayer compound 3 to be formed on the outer periphery, namely the side surface, outermost surface, and bottommost surface of the multilayer graphene 1. Performing two types of processing for forming the second interlayer compound 3 allows for further blocking the leaking points of the first interlayer compound 2 with the second interlayer compound 3, thereby further preventing a decrease in conductivity of the graphene wiring structure.

Some elements are expressed by chemical symbol. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A graphene wiring structure comprising:
multilayer graphene;
a first interlayer compound existing in an interlayer space of the multilayer graphene; and
a second interlayer compound existing in the interlayer space of the multilayer graphene,
wherein the second interlayer compound comprises at least one of an oxide, a nitride and a carbide, and,
the second interlayer compound exists on a side surface of the multilayer graphene.

2. The structure according to claim 1,
wherein the multilayer graphene is a lamination of flat graphene sheets, and
the second interlayer compound exists in the interlayer space of the multilayer graphene such that the second interlayer compound blocks at least a part of a grain boundary and a flaw of the flat graphene sheet.

3. The structure according to claim 1,
wherein the first interlayer compound is one or more types selected from among metal chloride, metal fluoride, alkali metal, alkaline-earth metal, halogen, and interhalogen compound,
the second interlayer compound is one or more types selected from among metal oxide, metal nitride, and metal carbide,
the metal chloride is a chloride of one or more types of metals selected from among Fe, Cu, Al and Mo,
the metal fluoride is a fluoride of one or more types of metals selected from among B and As,
the alkali metal is one or more types selected from among Li, Na and K,
the alkaline-earth metal is one or more types selected from among Mg and Ca,
the halogen is one or more types selected from among $F_2$, $Cl_2$, $Br_2$ and $I_2$,
the interhalogen compound is a compound of I and one or more types selected from among F, Cl and Br,
the metal oxide is an oxide of one or more types of metals selected from among Fe, Cu, Al and Mo,
the metal nitride is a nitride of one or more types of metals selected from among Fe, Cu, Al and Mo, and
the metal carbide is a carbide of one or more types of metals selected from among Fe, Cu, Al and Mo.

4. The structure according to claim 1,
wherein the first interlayer compound is one or more types selected from among metal chloride, metal fluoride, and interhalogen compound,
the second interlayer compound is one or more types selected from among metal oxide, metal nitride, and metal carbide,
the metal chloride is a chloride of one or more types of metals selected from among $FeCl_3$, $CuCl_2$, $AlCl_3$ and $MoCl_5$,
the metal fluoride is a fluoride of one or more types of metals selected from among $BF_3$ and $AsF_5$,
the interhalogen compound is a compound of one or more types selected from among IBr and ICl,
the metal oxide is an oxide of one or more types of metals selected from among $Fe_2O_3$, CuO, $Al_2O_3$ and $MoO_2$,
the metal nitride is a nitride of one or more types of metals selected from among $Fe_3N$, $Cu_3N_2$, AlN and $MoN_x$, and
the metal carbide is a carbide of one or more types of metals selected from among $Fe_3C$, $Cu_2C$, $Al_4C_3$ and $Mo_2C$.

5. The structure according to claim 1,
wherein the multilayer graphene is polycrystalline graphene.

6. The structure according to claim 1,
wherein a wiring width of the multilayer graphene is 20 nm or less.

7. The structure according to claim 1,
wherein the first interlayer compound and the second interlayer compound contain a common metal.

8. The structure according to claim 1,
wherein the second interlayer compound exists on entirety of the side surface of the multilayer graphene.

9. The structure according to claim 1,
wherein the second interlayer compound exists on entirety of side surfaces of the multilayer graphene.

10. The structure according to claim 1,
wherein the second interlayer compound is in physical contact with an edge of the multilayer graphene.

11. A graphene wiring structure comprising:
multilayer graphene;
a first interlayer compound existing in an interlayer space of the multilayer graphene; and
a second interlayer compound existing in the interlayer space of the multilayer graphene,
wherein the second interlayer compound containing at least one of an oxide, a nitride and a carbide,
the first interlayer compound is one or more types selected from among metal chloride, metal fluoride, alkali metal, alkaline-earth metal, halogen, and interhalogen compound, and
the second interlayer compound is one or more types selected from among metal oxide, metal nitride, and metal carbide.

12. The structure according to claim 11,
wherein the multilayer graphene is a lamination of flat graphene sheets, and
the second interlayer compound exists in the interlayer space of the multilayer graphene such that the second interlayer compound blocks at least a part of a grain boundary and a flaw of the flat graphene sheet.

13. The structure according to claim 11,
wherein the second interlayer compound exists on a side surface of the multilayer graphene.

14. The structure according to claim 11,
wherein the metal chloride is a chloride of one or more types of metals selected from among Fe, Cu, Al and Mo,
the metal fluoride is a fluoride of one or more types of metals selected from among B and As,
the alkali metal is one or more types selected from among Li, Na and K,
the alkaline-earth metal is one or more types selected from among Mg and Ca,
the halogen is one or more types selected from among $F_2$, $Cl_2$, $Br_2$ and $I_2$,
the interhalogen compound is a compound of I and one or more types selected from among F, Cl and Br,
the metal oxide is an oxide of one or more types of metals selected from among Fe, Cu, Al and Mo,
the metal nitride is a nitride of one or more types of metals selected from among Fe, Cu, Al and Mo, and
the metal carbide is a carbide of one or more types of metals selected from among Fe, Cu, Al and Mo.

15. The structure according to claim 11,
wherein the metal chloride is a chloride of one or more types of metals selected from among $FeCl_3$, $CuCl_2$, $AlCl_3$ and $MoCl_5$, the metal fluoride is a fluoride of one or more types of metals selected from among $BF_3$ and $AsF_5$, the interhalogen compound is a compound of one or more types selected from among IBr and ICl, the metal oxide is an oxide of one or more types of metals selected from among $Fe_2O_3$, CuO, $Al_2O_3$ and $MoO_2$, the metal nitride is a nitride of one or more types of metals selected from among $Fe_3N$, $Cu_3N_2$, AlN and $MoN_x$, and the metal carbide is a carbide of one or more types of metals selected from among $Fe_3C$, $Cu_2C$, $Al_4C_3$ and $Mo_2C$.

16. The structure according to claim 11,
wherein the multilayer graphene is polycrystalline graphene.

17. The structure according to claim 11,
wherein a wiring width of the multilayer graphene is 20 nm or less.

18. The structure according to claim 11,
wherein the first interlayer compound and the second interlayer compound contain a common metal.

19. The structure according to claim 13,
wherein the second interlayer compound exists on entirety of the side surface of the multilayer graphene, or
the second interlayer compound exists on entirety of side surfaces of the multilayer graphene.

20. The structure according to claim 13,
wherein the second interlayer compound is in physical contact with an edge of the multilayer graphene.

\* \* \* \* \*